(12) United States Patent
Turnquist et al.

(10) Patent No.: US 6,532,561 B1
(45) Date of Patent: Mar. 11, 2003

(54) EVENT BASED SEMICONDUCTOR TEST SYSTEM

(75) Inventors: James Alan Turnquist, Santa Clara, CA (US); Shigeru Sugamori, Santa Clara, CA (US); Rochit Rajsuman, Santa Clara, CA (US); Hiroaki Yamoto, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/406,300

(22) Filed: Sep. 25, 1999

(51) Int. Cl.[7] .......................... G01R 31/28; G06F 11/00
(52) U.S. Cl. ......................................... 714/738
(58) Field of Search ................... 714/724, 738, 714/799, 25, 718, 32, 33, 39; 702/119, 79, 85; 716/4; 703/17; 324/731.1; 365/189.07, 201

(56) References Cited

U.S. PATENT DOCUMENTS 6,226,765 B1 * 5/2001 Le et al. ..................... 365/201

* cited by examiner

Primary Examiner—Albert DeCady
Assistant Examiner—Guy Lamarre
(74) Attorney, Agent, or Firm—Muramatsu & Associates

(57) ABSTRACT

An event based test system is configured to test an electronics device under test (DUT) by supplying a test signal to the DUT and evaluating an output of the DUT at a timing of a strobe signal. The event based test system includes an event memory for storing timing data of each event formed with an integer multiple of a reference clock period and a fraction of the reference clock period wherein the timing data represents a time difference between a current event and a reference point, an address sequencer for generating address data for accessing the event memory, a timing count and scaling logic for generating an event start signal, an event generation unit for generating each event based on the event start signal and data indicating the fraction of the reference clock period, and a host computer for controlling an overall operation of the event based test system.

12 Claims, 15 Drawing Sheets

|  | Clock Count Data | Clock Count Sum (CCS) | Vernier Data (V) | Result Event Time (CCS + V) |
|---|---|---|---|---|
| Event 1 | 1 | 1 | $\frac{3}{16}$ | $1\frac{3}{16}$ |
| Event 2 | 1 | 2 | $\frac{10}{16}$ | $2\frac{10}{16}$ |
| Event 2 | 2 | 4 | $\frac{2}{16}$ | $4\frac{2}{16}$ |

Fig. 10B

|  | Clock Count | Vernier Count | Vernier Sum | Total Time |
|---|---|---|---|---|
| Event 1 | 1 | $\frac{3}{16}$ | $\frac{3}{16}$ | $1\frac{3}{16}$ |
| Event 2 | 1 | $\frac{7}{16}$ | $\frac{10}{16}$ | $2\frac{10}{16}$ |
| Event 3 | 1 | $\frac{8}{16}$ | $\frac{18}{16} \rightarrow \frac{2}{16}$ | $4\frac{2}{16}$ |

| Event | Clock Count Memory (27 bit width) | Vernier Memory (10 bit width) |
|---|---|---|
| T0 | T0 coarse data | T0 fine data |
| T1 | T1 coarse data | T1 fine data |
| T2 | T2 coarse data | T2 fine data |
| T3 | T3 coarse data | T3 fine data |
| T4 | T4 coarse data | T4 fine data |
| T5 | T5 coarse data | T5 fine data |
| T6 | T6 coarse data | T6 fine data |
| T7 | T7 coarse data | T7 fine data |
| T8 | T8 coarse data | T8 fine data |
| T9 | T9 coarse data | T9 fine data |
| T10 | T10 coarse data | T10 fine data |

Fig. 12B

| Event | Clock Count Memory (8 bit) | Vernier Memory (40 bit width) |
|---|---|---|
| T0 | T0 Count (Word 0) | T3 Vernier, T2 Vernier, T1 Vernier, T0 Vernier |
| T1 | T1 Count (Word 0) | T7 Vernier, T6 Vernier, T5 Vernier, T4 Vernier |
|  | T1 Count (Word 1) | (Next data), T10 Vernier, T9 Vernier, T8 Vernier |
| T2, T3 | T2 Count (Word 0) | (Next vernier data) |
|  | T2 Count (Word 1) | (Next vernier data) |
|  | T2 Count (Word 2) | (Next vernier data) |
| T4, T5, T6 | T4 Count (Word 0) | (Next vernier data) |
|  | T4 Count (Word 1) | (Next vernier data) |
|  | T4 Count (Word 2) | (Next vernier data) |
|  | T4 Count (Word 3) | (Next vernier data) |
| T7, T8, T9, T10 | T7 Count (Word 0) | (Next vernier data) |

EVENT BASED SEMICONDUCTOR TEST SYSTEM

FIELD OF THE INVENTION

This invention relates to an automatic test equipment for testing semiconductor devices for supplying test pattern signals to a semiconductor device and evaluating resultant output signals of the semiconductor device, and more particularly, to an event based semiconductor test system for producing events of various timings to be used as test pattern signals and strobe signals to evaluate semiconductor devices wherein the timing of each of the events is defined by a time length from a predetermined point.

BACKGROUND OF THE INVENTION

In testing semiconductor devices such as ICs and LSIs by a semiconductor test system, such as an IC tester, a semiconductor device to be tested is provided with test signals at its appropriate pins with predetermined test timings. The semiconductor test system receives output signals from the device under test generated in response to the test signals. The output signals are sampled by strobe signals with specified timings to be compared with expected value data to determine whether the semiconductor device under test functions correctly or not.

FIG. 1 is a schematic block diagram showing an example of a conventional semiconductor test system. In the semiconductor test system of FIG. 1, a pattern generator 12 receives test data from a test processor 11. The pattern generator 12 generates test pattern data to be provided to a wave formatter 14 and an expected value pattern to be provided to a pattern comparator 17. A timing generator 13 generates timing signals to synchronize the operation of the overall test system. In FIG. 1, the timing signals are provided, for example, to the pattern generator 12, the pattern comparator 17, the wave formatter 14, and an analog comparator 16.

The timing generator 13 also provides a test cycle (tester rate) pulse and timing data to the wave formatter 14. The pattern (test vector) data defines "0" and "1", i.e., rising and falling edges of the test signal waveform. The timing data (timing set data) defines timings (delay times) of the rising and falling edges of the waveform relative to the test cycle pulse. Typically, the timing data also includes waveform information such as an RZ (return to zero), NRZ (non-return to zero) or EOR (exclusive OR) waveform.

Based on the pattern data from the pattern generator 12 and the test cycle pulse and timing data from the timing generator 13, the wave formatter 14 forms a test signal having specified waveforms and timings. The wave formatter 14 sends the test signal to the DUT 19 through a driver 15. The wave formatter 4 includes set/reset flip-flops (not shown) to form the test signal to be provided to the driver 15. The driver 15 regulates the amplitude, impedance, and/or slew rate of the test signal and applies the test signal to the DUT 19.

A response signal from the DUT 19 is compared with a reference voltage at a predetermined strobe timing by the analog comparator 16. The resultant logic signal is provided to the pattern comparator 17 wherein a logic comparison is performed between the resultant logic pattern from the analog comparator 16 and the expected value pattern from the pattern generator 12. The pattern comparator 17 checks whether two patterns match with each other or not, thereby determining pass or failure of the DUT 19. When a failure is detected, such failure information is provided to a fail memory 18 and is stored along with the information of the failure address of the DUT 19 from the pattern generator 12 in order to perform failure analysis.

In the conventional semiconductor test system such as shown in FIG. 1, a test signal to be applied to the device under test is produced in a cycle by cycle manner based on three kinds of data, pattern (vector) data, timing data and waveform data. FIG. 2 shows an example of relationship among the three kinds of data as well as the test cycle to generate test signals shown in waveform illustration 45. Pattern data (test vector) 46 from a test vector file 41 is provided to the wave formatter 14 through the pattern generator 12. Timing data 47 from a test plan file 42 is provided to the wave formatter 14 through the timing generator 14. The pattern data 46 defines edges (1 or 0) in each test cycle and the timing data 47 defines waveforms and timings, i.e., delay time relative to the test cycle.

As noted above, in the conventional semiconductor test system, the test signals and strobe signals are produced based on the pattern data, timing data and waveform data relative to each test cycle. Such a test system is sometimes called a cycle based test system in which timing data and pattern data are described in a cycle by cycle basis. In computer aided design (CAD) systems widely used today for designing a semiconductor device such as an LSI and VLSI, typical logic simulators describe test signals and results based on event basis. Events are any changes in the logic state, such as rising and falling edges of test signals and are defined with respect to time lengths from a reference time point. In other words, event based description of test signals and test results does not utilize the idea of test cycles used in the conventional test system. Therefore, the conventional cycle based test system cannot make direct use of the test signals and test results obtained in the design stage of the semiconductor devices.

SUMMARY OF THE INVENTION

Therefore, it is an object of the present invention to provide an event based semiconductor test system for producing test signals and test strobes directly from event data in an event memory to evaluate a semiconductor device.

It is another object of the present invention to provide an event based semiconductor test system wherein the timing of each of the events is defined by a time length from a predetermined reference point.

It is a further object of the present invention to provide an event based semiconductor test system wherein the timing of each of the events is defined by a time length from the last event.

It is a further object of the present invention to provide an event based semiconductor test system in which a time length between events is defined by a combination of an integer multiple of a reference clock cycle and a fraction of the reference clock cycle.

It is a further object of the present invention to provide an event based semiconductor test system which is capable of scaling the timing data for producing the current events by modifying the delay times of the current events in proportion to a scaling factor.

It is a further object of the present invention to provide an event based semiconductor test system incorporating a data compression and decompression technology for storing event data in an event memory for decreasing a capacity of the event memory.

It is a further object of the present invention to provide an event based semiconductor test system which is capable of directly using data produced by a test bench of a CAD system in a design stage of the semiconductor device under test for generating test signals and strobes.

The present invention is an event based test system for testing an electronics device under test (DUT) by supplying a test signal to the DUT and evaluating an output of the DUT at a timing of a strobe signal. The event based test system includes: an event memory for storing timing data of each event formed with an integer multiple of a reference clock period (integral part data) and a fraction of the reference clock period (fractional part data) wherein the timing data represents a time difference between a current event and a common reference point, an address sequencer for generating address data for accessing the event memory to read out the timing data therefrom, a timing count and scaling logic for generating an event start signal which is delayed by the reference clock period multiplied with the integral part data, an event generation unit for generating each event based on the event start signal from the timing count and scaling logic and the fractional part data from the event memory for formulating the test signal or strobe signals, and a host computer for controlling an overall operation of the event based test system through a test program.

In a further aspect of the present invention, the event memory is comprised of a clock count memory for storing the integral part data of the timing data of each event, a vernier memory for storing the fractional part data of the timing data of each event, and an event type memory for storing data representing a type of each event corresponding to the timing data in the clock count memory and the vernier count memory.

In a further aspect of the present invention, the event based test system further includes a decompression unit between the event memory and the timing count and scaling logic for reproducing event data from compressed event data stored in the event memory, and the timing count and scaling logic includes a scaling function which modifies the event data from the event memory in proportion to a scaling factor.

In a further aspect of the present invention, the event generation unit is comprised of a demultiplexer for selectively providing the event start signal from the timing count and scaling logic based on event type data from the event memory, a plurality of variable delay circuits for receiving the event start signal from the demultiplexer where each of the variable delay circuits provides an additional delay defined by vernier sum data from the timing count and scaling logic, means for producing variable offset delay between test signals.

According to the present invention, an event based semiconductor test system is capable of producing test signals and strobes based on the event data stored in the event memory to evaluate a semiconductor device. The timing of each of the events is defined by a difference of time length from the common reference point (absolute time) or from the last event (delta time). The test signals and strobes are produced based on event information whose delta time from the previous event is defined by a combination of an integer multiple of the reference clock period and a fraction of the reference clock period.

BRIEF DESCRIPTION OF THE DRAWINGS

FIG. 10A is a data table showing relationships among various timings for generating the events shown in FIGS. 5I–5K with use of circuit diagram of FIG. 7.

FIG. 11 is a timing chart showing an example of event sequence for explaining event data compression and decompression technology in the event based test system of the present invention.

FIG. 12A is a data table showing event data stored in an event memory (clock count memory and vernier memory) without data compression and FIG. 12B is a data table showing event data stored in the event memory with use of the data compression of the present invention, respectively, for generating the events shown in FIG. 11.

DETAILED DESCRIPTION OF THE PREFERRED EMBODIMENT

Figure 3:
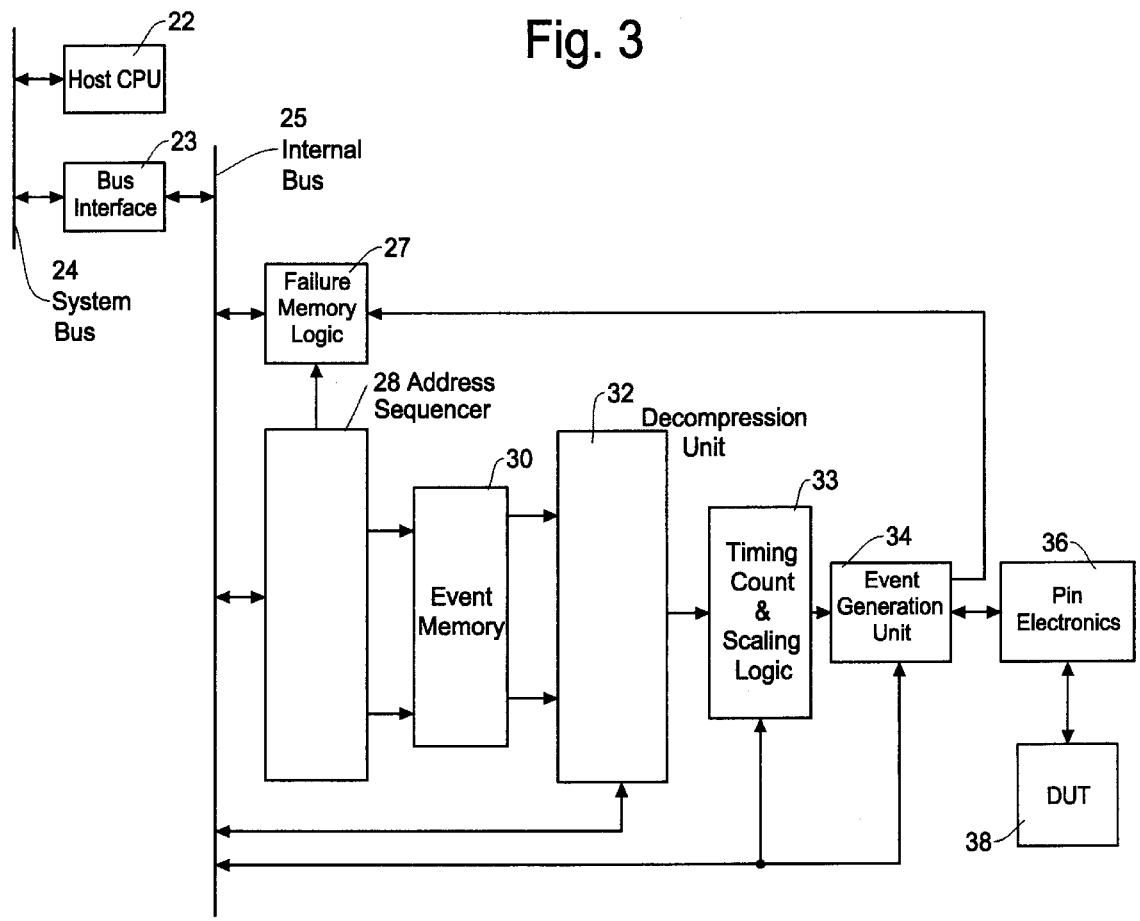
FIG. 3 is a block diagram showing an example of structure in an event based semiconductor test system of the present invention.

FIG. 3 is a schematic block diagram showing an example of structure in the event based test system of the present invention. The event based test system includes a host computer 22 and a bus interface 23 both are connected to a system bus 24, an internal bus 25, an address sequencer 28, a failure memory 27, an event memory 30, a decompression unit 32, a timing count and scaling logic 33, an event generation unit 34, and a pin electronics 36. The event based test system is to evaluate a semiconductor device under test (DUT) 38, which is typically a memory IC, a microprocessor IC, or an ASIC connected to the pin electronics 36.

An example of the host computer 22 is a work station. The host computer 22 functions as a user interface to enable a user to instruct the start and stop operation of the test, to load a test program and other test conditions, or to perform test result analysis in the host computer. The host computer 22 interfaces with a hardware test system through the system bus 24 and the bus interface 23. Although not shown, the host computer 22 is preferably connected to a communication network to send or receive test information from other test systems or computer networks.

The internal bus 25 is a bus in the hardware test system and is commonly connected to most of the functional blocks such as the address sequencer 28, failure memory 27, decompression unit 32, timing count and scaling logic 33, and event generation unit 34. An example of the address sequencer 28 is a test processor exclusive to the hardware test system and is not accessible by a user. The address sequencer 28 provides instructions to other functional blocks in the test system based on the test program and conditions from the host computer 22. The failure memory 27 stores test results, such as failure information of the DUT 38, in the addresses defined by the address sequencer 28. The information stored in the failure memory 27 is used in the failure analysis stage of the device under test.

One of the jobs of the address sequencer 28 is to provide address data to the event memory 30 as shown in FIG. 3. In an actual test system, a plurality of event memories 30 will be provided, each of which may correspond to a test pin (test channel) of the test system. The event memory 30 stores the timing data for each event of the test signals and strobe signals. As will be described in more detail later, the event memory 30 stores the event data in two separate manners, one for storing the timing data which is an integer multiple of one cycle of the reference clock, and the other for storing the timing data which is a fraction or fractions of one cycle of the reference clock. In the present invention, the timing data for each event is expressed by a time difference from the common reference point (absolute time) or from the last event (delta time), which will also be described in more detail later.

Preferably, the timing data in the event memory 30 is compressed to reduce the required memory capacity. The decompression unit 32 receives the compressed data from the event memory 30 and reproduce the timing data by a decompression process.

The timing count and scaling logic (hereafter may also referred to as "event count logic") 33 is to produce overall timing data which can directly produce a current event based on the delta timing data from the event memory 30. An example of such overall timing data is a combination of an event start signal and a delay time from the event start signal. In one aspect, a process of producing such overall timing data involves a summing operation in which a plurality of fractional (vernier) timing data are accumulated. During the process of summing the timing data, a carry over operation of the fractional data (offset to the integer data) is also conducted in the timing count and scaling logic 33. In another aspect, a process of producing the overall timing data does not involve the summing process.

The timing count and scaling logic 33 also functions to modify the timing data in proportion to a scaling factor. Such a scaling operation of the timing data consists of multiplying timing data (each delta time or absolute time) by a scaling factor. For example, to scale timing data showing "1.5" of a system (reference) clock by a scaling factor "2" means that the resultant timing data is 1.5×2=3.0 of the system clock. Generally, for the timing data (delay time) defined by the event count and event vernier as above, this multiplication would consist of (event count+event vernier)×Scale factor)= Scaled delay.

Software can perform the above noted operations of summing and scaling. However, the time required to transform a large data base of delays, as well as, the time to reload this data into an event based tester may be large, the faster summing and scaling operation may be implemented directly by hardware. A variety of scaling technologies may be feasible in the event based test system.

Figure 1:
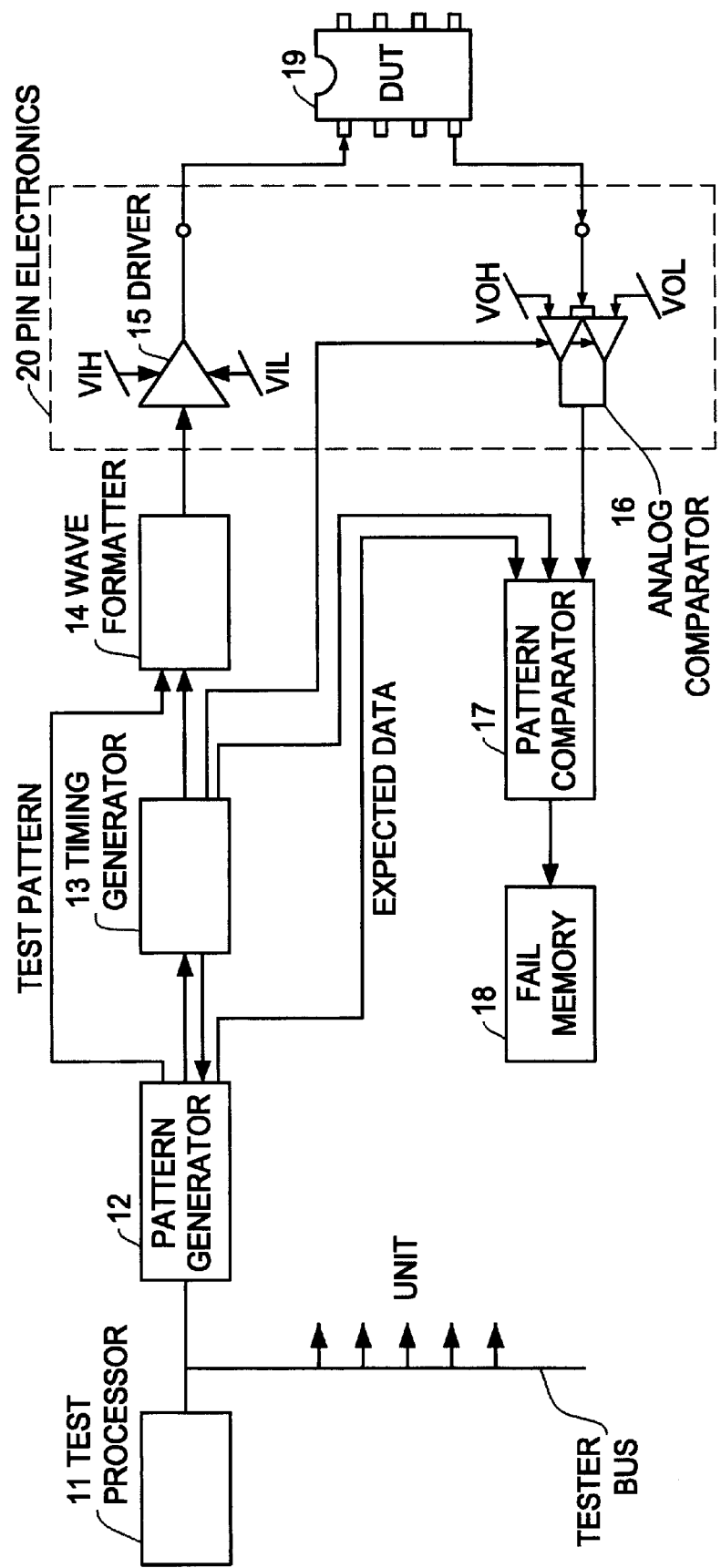
FIG. 1 a schematic block diagram showing an example of structure in a conventional semiconductor test system which generates test signals and test strobes based on test data described in a cycle base.
Figure 2:
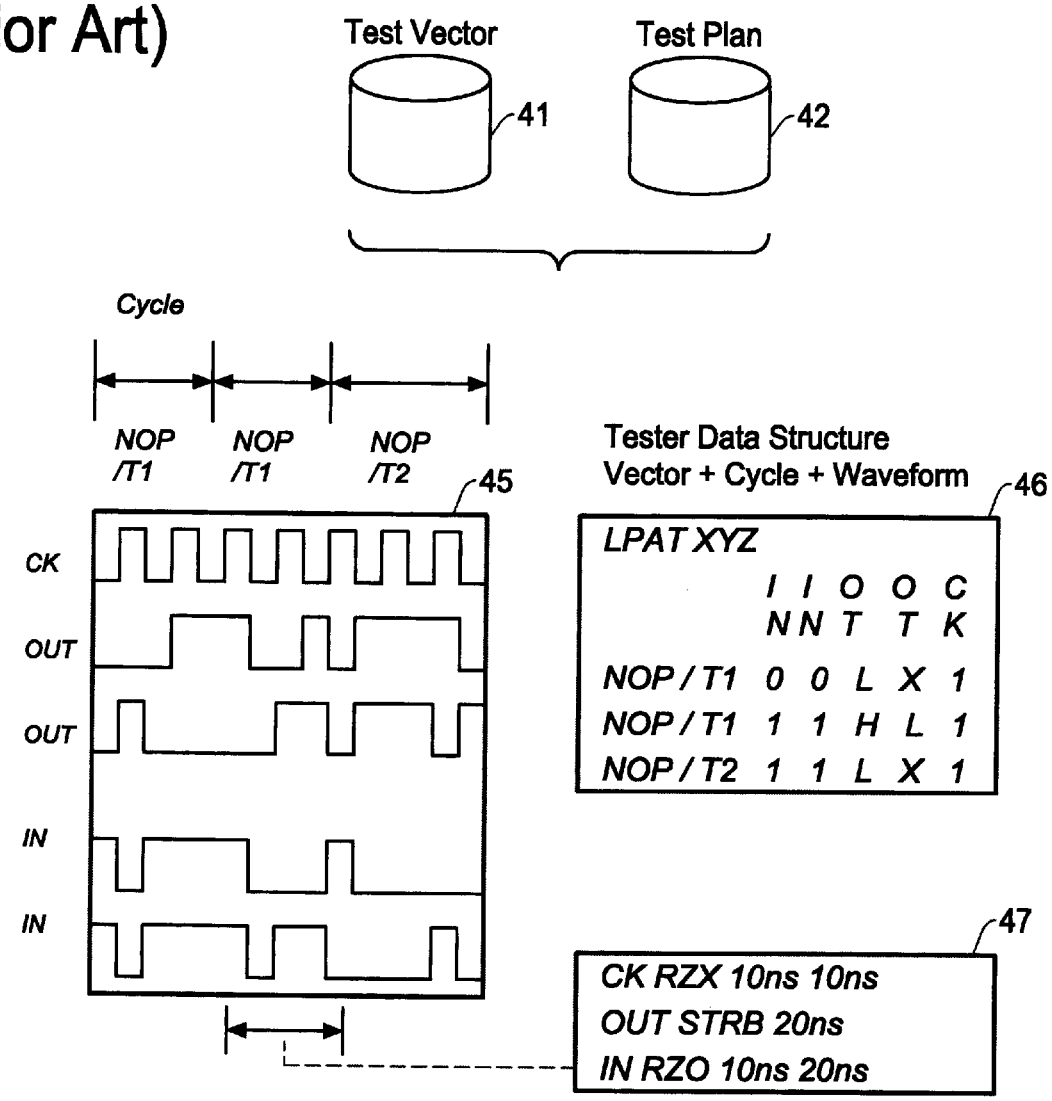
FIG. 2 is a diagram showing an example of data structure used in a cycle based test system of FIG. 1 for producing a test signal using pattern data, timing data and waveform data for each test cycle.

The event generation unit 34 is to actually generate the events based on the overall timing data from the timing count and scaling logic 33. The events (rising and falling points of test signals and strobe signals) thus generated are provided to the DUT 38 through the pin electronics 36. Basically, the pin electronics 36 includes a large number of interface circuits for interfacing between the semiconductor test system and the semiconductor device to be tested. For example, each interface circuit is formed of a driver and a comparator such as shown in FIG. 1 as well as switches to establish input and output relationships with respect to the driver, comparator and the DUT 38.

Figure 4:
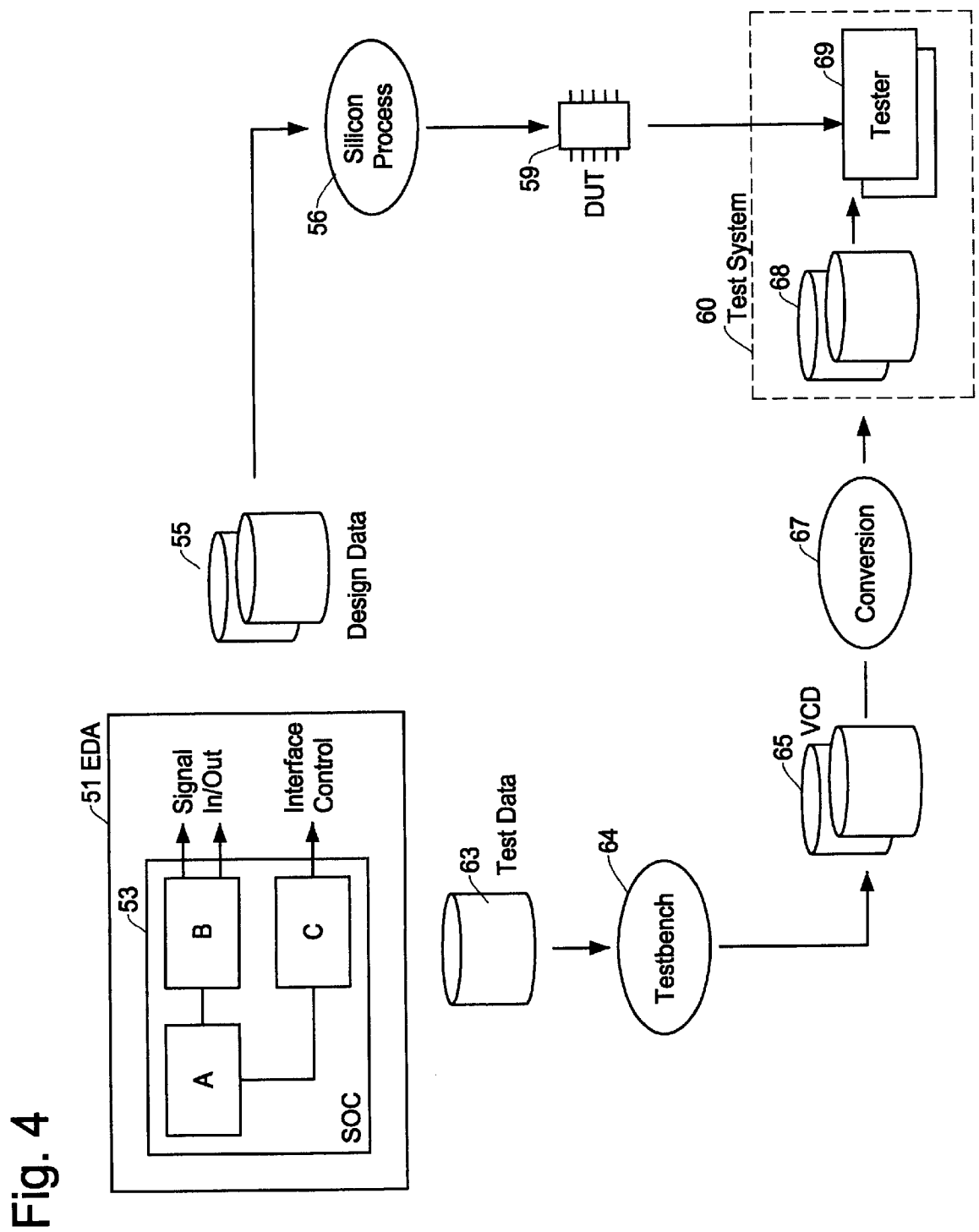
FIG. 4 is a schematic block diagram showing a relationship between an electronic design automation environment and an event based test system of the present invention.

FIG. 4 is a schematic diagram showing an overall relationship between a design stage of a semiconductor integrated circuit and a test stage of the semiconductor integrated circuit. This example shows a situation where a very large scale integrated circuit (LSI), such as a system-on-a-chip (SoC) 53 is designed under an electronic design automation (EDA) environment 51.

As a result of designing the semiconductor integrated circuit 53 under the EDA environment 51, the design stage produces a design data file 55 and a test data file 63. Through various data conversion processes, the design data is converted to physical level data indicating each gate in the designed semiconductor integrated circuit. Based on the physical level data, an actual integrated circuit 59 is produced in a semiconductor integrated circuit production process (silicon process).

The integrated circuit thus produced is tested by a semiconductor test system 60. By executing a logic simulation by a testbench 64 with use of the test data derived through the design stage of the integrated circuit, a data file 65 showing input-output relationships in the integrated circuit is created. An example of such a data file is VCD (Value Change Dump) of Verilog.

In the case where the semiconductor test system is cycle based as in the conventional technology, a format conversion process is performed by a conversion software 67 so that the VCD data file 65 described in an event base format is converted to a test signal of a cycle base format. As a consequence, a test pattern in the cycle base is stored in a file 68 in the semiconductor test system 60. A hardware tester 69 applies the test pattern to the device under test 59 for testing the device functions and the like. The event based test system of the present invention can directly utilize the VCD data file 65 by storing the VCD data in the event memory 30 in FIG. 3.

Figure 6:
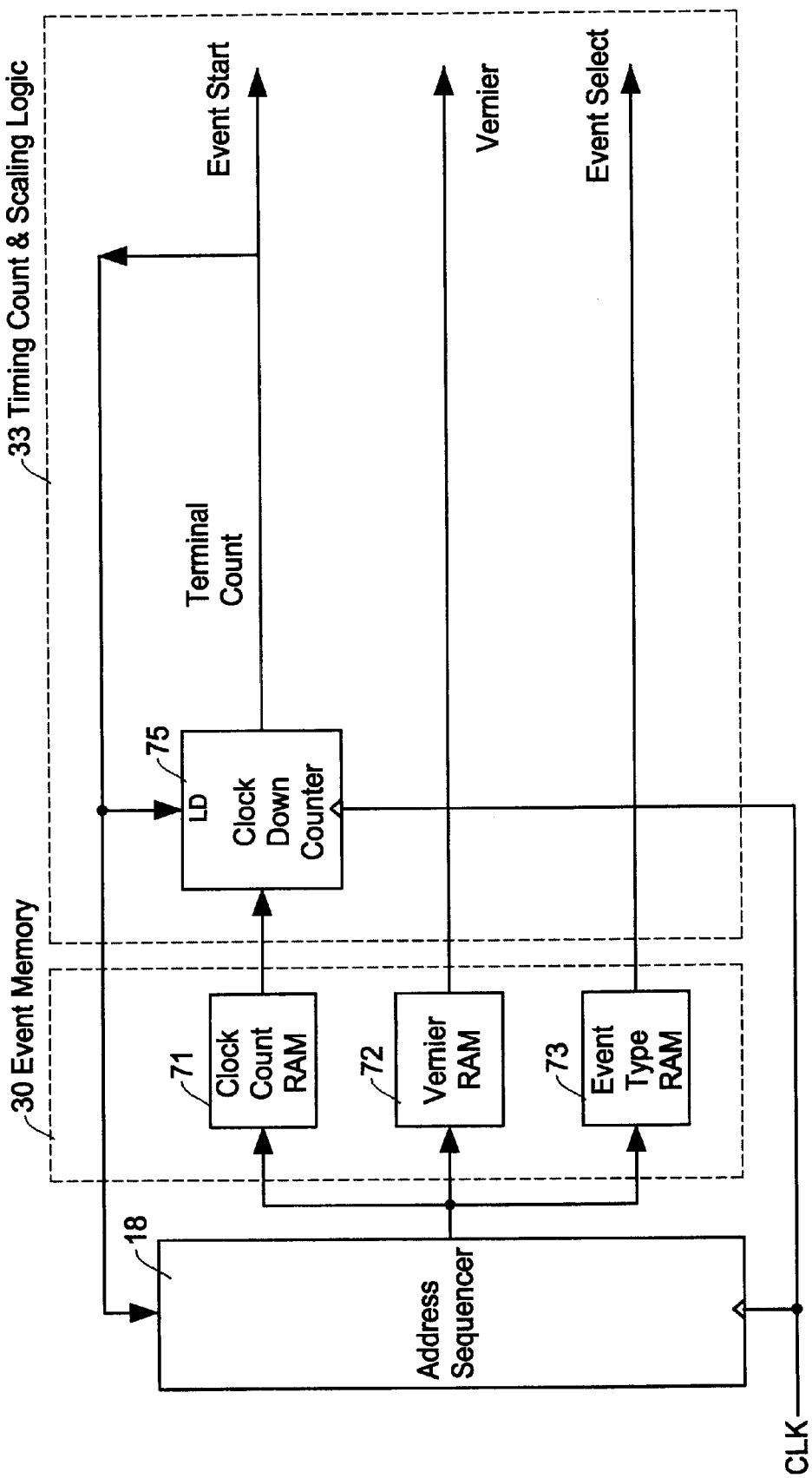
FIG. 6 is a schematic diagram showing an example of configuration in the event memory and the timing count and scaling logic in the event based test system of the present invention.
Figure 7:
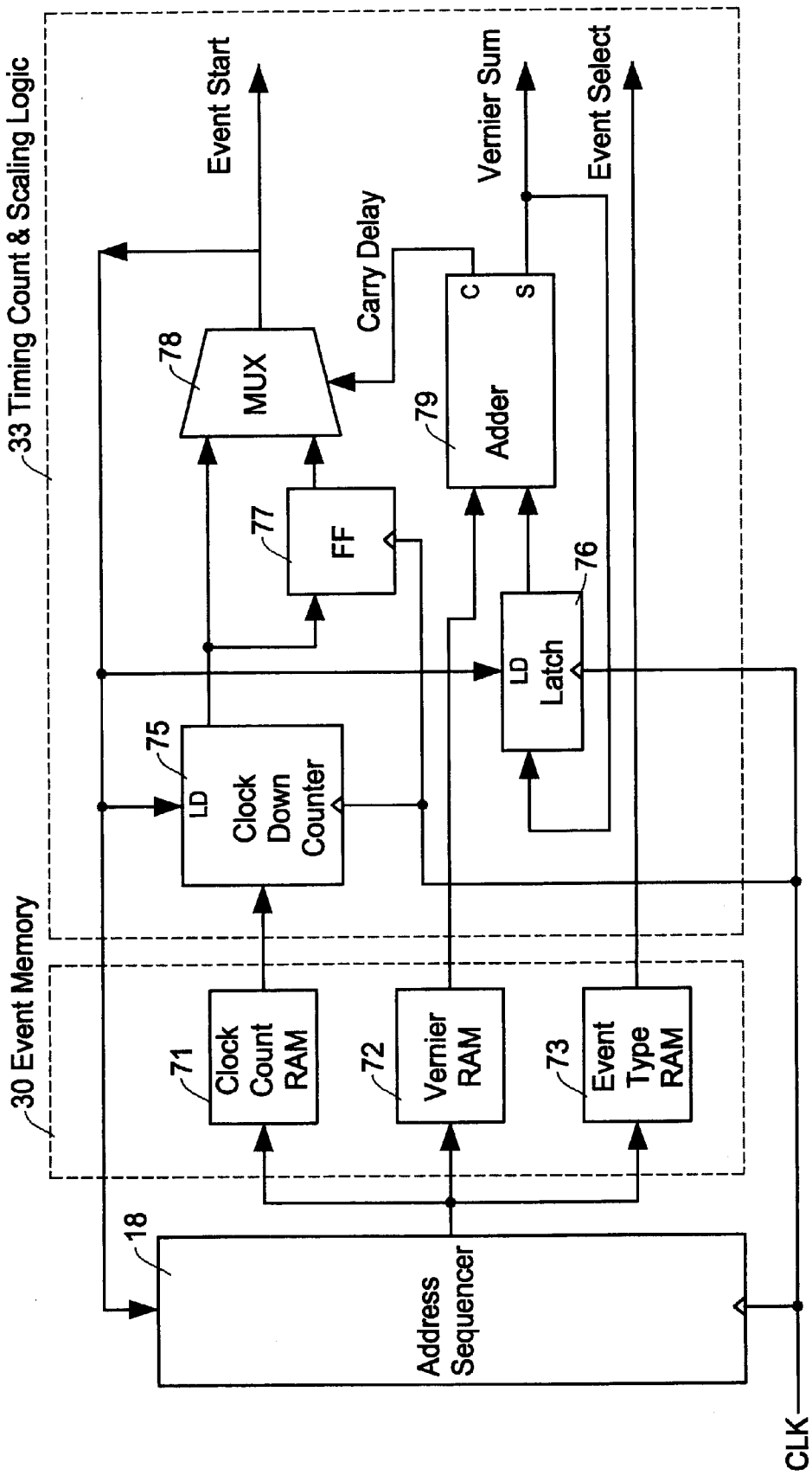
FIG. 7 is a schematic diagram showing another example of configuration in the event memory and the timing count and scaling logic in the event based test system of the present invention.

FIGS. 5A–5K show an example of operation for generating events based on the event data. FIG. 6 is a circuit diagram showing an example of structure in the timing count and scaling logic (event count logic) 33 for producing an event start signal and vernier data based on the timing data from the event memory 30 described relative to a common reference point, i.e., absolute time. FIG. 7 is a circuit diagram showing another example of structure in the timing count and scaling logic (event count logic) 33 for producing an event start signal and vernier data based on the timing data from the event memory 30 described relative to a previous event, i.e., delta time. The example of FIG. 6 does not have a summing function while the example of FIG. 7 includes a function for summing the timing data and generating carry signals. It should also be noted that, for simplicity of explanation, the circuit structures of FIGS. 6 and 7 do not show circuit diagrams for scaling logic.

In FIGS. 6 and 7, the address sequencer 28 supplies address data to the event memory 30. As noted above, the address sequencer 28 can be a tester processor having a microprocessor. However, in the simplest case, the address sequencer 28 is an address counter. The address counter would start at a count of zero and increment sequentially by one until a preset stop address is detected. The number of bits wide depends upon the depth of the event memory to be supported, however, in an actual implementation, 16 bits would be the minimum requirements.

In the example of FIG. 6, the event memory 30 is formed with a clock count RAM 71, a vernier RAM 72, and an event type RAM 73. The clock count RAM 71 stores the integral part of the timing data, i.e., the integer multiple of the reference clock interval. The vernier RAM 32 stores fractional part (vernier) of the timing data, i.e., the fractions of the reference clock interval. The event type RAM 73 stores the data for selecting event types. The event type is a selection of setting the tester output pin signals (test signals) to a logic "1", "0" or "high impedance", or setting types of expected data for latching the response signals from the DUT 38 at the timings of the strobe signals.

Figures 9, 10A:
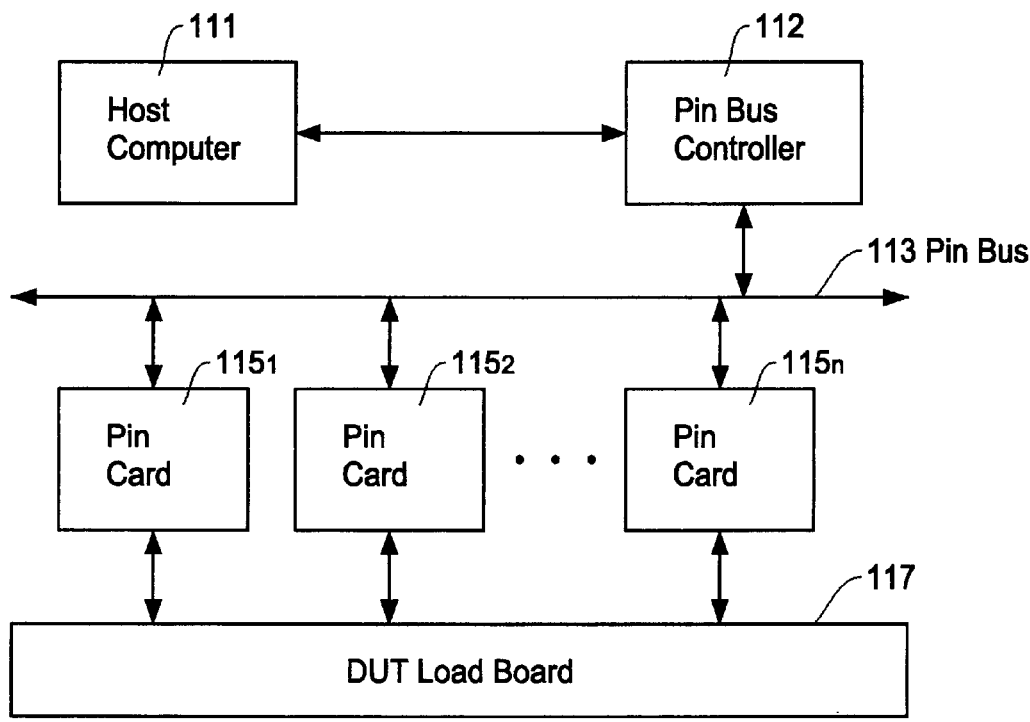
FIG. 9 is a schematic diagram showing a basic system configuration of the event based test system of the present invention.
FIG. 10A is a data table showing relationships among various timings for generating the events shown in FIGS. 5I–5K with use of circuit diagram of FIG. 6.

For generating the events in the example of FIGS. 5I–5K by the timing count and scaling logic of FIG. 6, the data to be stored in the event memory 30 is shown in the data table of FIG. 10A. As noted above, the timing data in the timing memory 30 describes the timing of each event relative to a common reference point. In other words, the timing data shows absolute times of the events to be produced from the predetermined point. Therefore, the timing count and scaling logic of FIG. 6 does not include the summing function.

In the example of FIGS. 5A–5K, the timing of Event 1 is 1($3/16$)ns (nanosecond) from a reference (start) point as shown in FIG. 5I. For the Event 1, the timing data in the clock count RAM 71 is "1" while the data in the vernier RAM 72 is $3/16$. The timing of Event 2 is 2($10/16$)ns apart from the reference point as shown in FIG. 5J. Thus, the timing data in the clock count RAM 71 is "2" while the fraction data in the vernier RAM 72 is $10/16$. Since the timing of Event 3 is 4($2/16$)ns from the reference point as shown in FIG. 5K, the timing data in the clock count RAM 71 is "4" while the fraction data in the vernier RAM 72 is $2/16$.

The data (integral part) in the clock count RAM 71 represents the number of reference (system) clock counts to wait before executing the associated event, i.e., the timing of an event start signal. In the vernier RAM 72, the number of bits allocated for the vernier part determines the number of fractional units per clock, i.e, the timing of the event to be produced after the event start signal. In the above example, the number of fractional units is "16" for each cycle of the reference clock.

The event data from the event memory 30 is received by the timing count and scaling logic of FIG. 6. In this example, the circuit diagram of FIG. 6 includes only a down counter 75 for counting down the number of reference clock pulses (FIG. 5A). The data from the clock count RAM presets the down counter 75 so that the down counter 75 counts the reference clock and generates a terminal count (event start signal) when the preset data reaches zero. The vernier data from the vernier RAM 72 and the event type data from the event type RAM are directly supplied to the event generation unit 34.

Thus, in the example of FIGS. 5A–5K, an event start signal shown in FIG. 5B and vernier data showing the fractional time difference in FIG. 5C are provided to the event generation unit 34, thereby generating Event 1 of FIG. 5I. Then, an event start signal of FIG. 5D is generated when counting two clock pulses and provided to the event generation unit 34 along with the vernier data showing the fractional time difference $10/16$ of FIG. 5E, thereby generating Event 2 of FIG. 5J. An event start signal of FIG. 5G is generated when counting four clock pulses and provided to the event generation unit 34 along with the vernier data showing the fractional time difference $2/16$ of FIG. 5H, thereby generating Event 3 of FIG. 5K.

The example of FIG. 7 has the summing function to be used for processing the event data showing a time difference of each event from a previous event, i.e., delta time. In this case, the timing data of a current event in the event memory 30 is expressed by a delay time from a previous event. Thus, for Event 1 of FIG. 5I, the timing data in the clock count RAM 71 is "1" while the data in the vernier RAM 72 is $3/16$. The timing of Event 2 is 1($7/16$)ns apart from Event 1 as shown in FIG. 5J. Thus, the timing data in the clock count RAM 71 is "1" while the fraction data in the vernier RAM 72 is $7/16$. Since the timing of Event 3 is 1($8/16$)ns after Event 2 as shown in FIG. 5K, the timing data in the clock count RAM 71 is "1" while the fraction data in the vernier RAM 72 is $8/16$.

The data (integral part) in the clock count RAM 71 represents the number of reference (system) clock counts to wait before executing the associated event. The data (fractional part) in the vernier RAM 72 is the number of vernier units to wait after the integral clock counts have expired (event start) to execute the event. The number of bits allocated for the vernier part determines the number of fractional units per clock. In the above example, the number of fractional units is "16" for each cycle of the reference clock.

The vernier sum in the table of FIG. 10B shows the sum of fractional data in the previous events and the present event. For example, the vernier sum for Event 2 is "$10/16$" which is a sum of the vernier count "$3/16$" in Event 1 and the vernier count "$7/16$" in Event 2. The vernier sum for Event 3 is "$18/16$" which is a sum of the vernier count "$3/16$" in Event 1, the vernier count "$7/16$" in Event 2 and the vernier count "$8/16$" in Event 3. Because of the summing operation, the vernier sum of $2/16$ for Event 3 is produced while the clock count is added by one.

Figure 5:
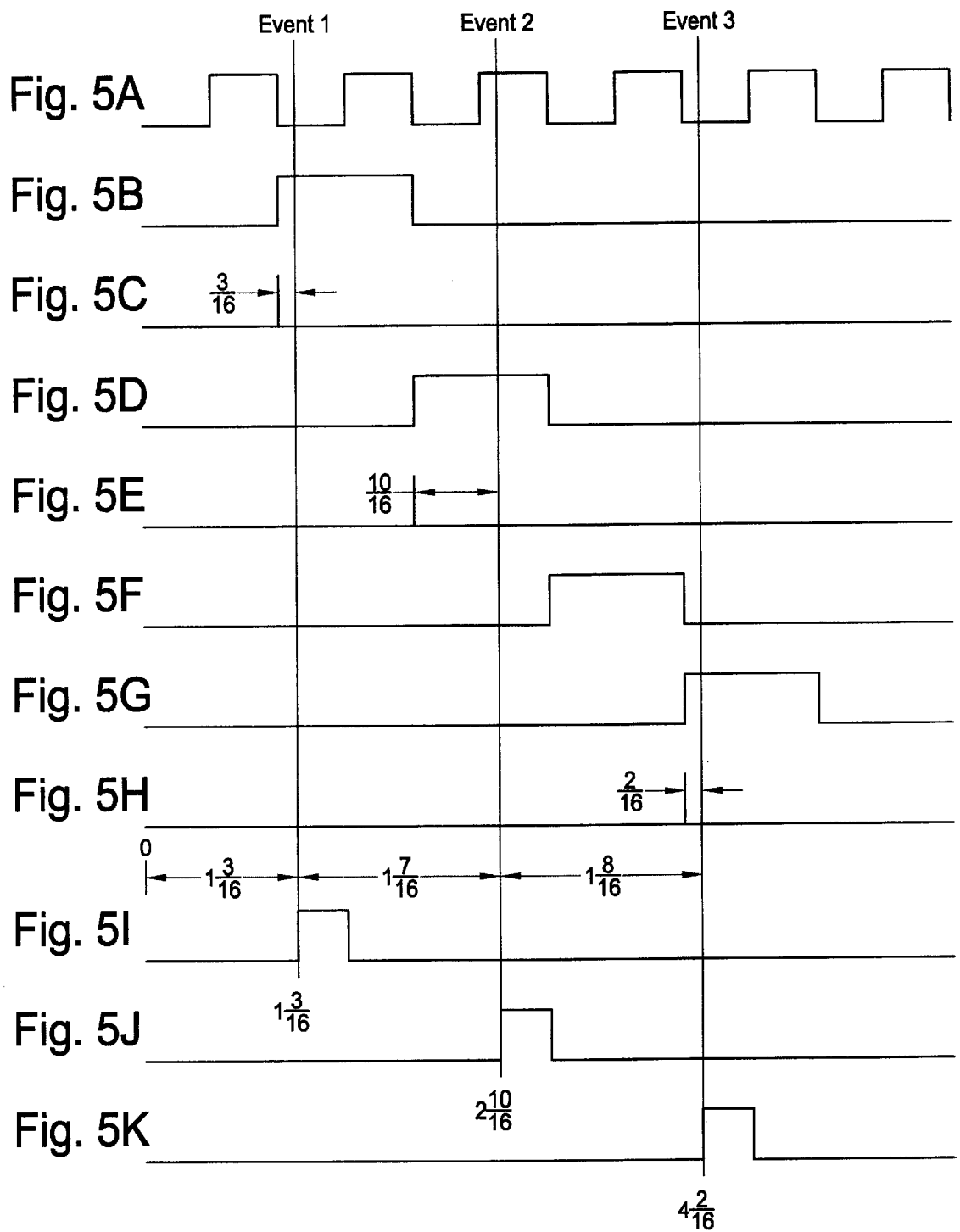
FIGS. 5A–5K are timing charts showing an example of operation in an event based test system of the present invention for producing test signal edges (events) of FIGS. 5I–5K based on event data stored in an event memory.

The total time in the right column of FIG. 10B represents overall timings of the events with respect to the start (reference) point "0" in FIG. 5. Such a total time is produced by summing the integral parts of the timing data and the fractional parts of the timing data. When the sum of the fractional parts exceeds the unit time interval of the reference clock, the data in the integral part is increased accordingly. The total time of Event 1 is 1($3/16$)ns apart from the reference point. The total time of Event 2 is 2($10/16$)ns apart from the reference point, while the total time of Event 3 is 4($2/16$)ns apart from the reference point as also shown in. FIGS. 5I–5k, respectively. Therefore, the event start signal and vernier sum for each of Events 1–3 are provided to the event generation unit 34 in the same manner described with reference to FIG. 6.

The timing count and scaling logic 33 of FIG. 7 includes a down counter 75, a latch 76, a flip-flop 77, a multiplexer 78 and an adder 79. The down counter 75 receives the integral part of the timing data from the clock count RAM 71. The adder 79 receives the fractional part of the timing data from the vernier RAM 72.

For example, the integral part data from the RAM 71 is preset in the down counter 75 which counts down the preset value by the clock reference CLK. When the down counter 75 reaches zero, an output signal (terminal count) is generated which is supplied to one input of the multiplexer 78. Another input of the multiplexer 78 is provided with the output of the flip-flop 77 which generates the output signal of the down counter 75 one clock cycle delayed. Thus, the multiplexer 78 inserts an additional clock delay count to the integral part data from the clock count RAM 71. The output of the multiplexer 78 is expressed as an event start which is the number of reference clock count values. The event start signal is provided to the event generation unit 34 and to the address sequencer 28.

The fractional part data from the vernier RAM 72 is provided to one input terminal of the adder 79. Another input terminal of the adder 79 is provided with the vernier data in the previous event through the latch 76. Thus, the adder 79 adds up all of the fractional part data from the vernier RAM 72. When the sum of the fractional data exceeds one clock count, i.e., $16/16$ as in the example of Event 3 in FIGS. 5 and 10A and 10B noted above, a carry is generated which is given to the multiplexer 78. In receiving the carry, the multiplexer 78 selects the output of the flip-flop 79 thereby delaying the event start signal by one reference clock count. Thus, in the example of FIG. 10B, the sum of the fractional data is "$18/16$" for Event 3, a carry is provided to the multiplexer 78 to cause an additional delay by one clock count in the event start. The remaining data of "$2/16$" is produced at the output of the adder 79 as a vernier sum.

Based on the foregoing, the process of generating Events 1–3 of FIGS. 5I–5K by the circuit of FIG. 7 is as follows. Because the integral part data for Event 1 is "1", the down counter 75 produces a pulse (terminal count) of FIG. 5B by counting one pulse of reference clock of FIG. 5A. The terminal count of FIG. 5B is output as the event start signal at the output of the multiplexer 78. FIG. 5C shows a vernier sum at the output of the adder 79 to be added to the event start signal in the event generation unit 34, thereby producing Event 1 of FIG. 3I.

Since the integral part data for Event 2 is also "1", the down counter 75 produces a pulse (terminal count) by counting one clock pulse. The terminal count of the down counter 75 is generated one cycle after the previous terminal count of FIG. 5B, thereby producing the event start shown in FIG. 5D at the output of the multiplexer 78. FIG. 5E shows a vernier sum at the output of the adder 79 to be added to the event start signal of FIG. 5D in the event generation unit 34. Since the fractional data of Event 1 is "$13/16$" and the fractional data of Event 2 is "$7/16$", the vernier sum of FIG. 5E at the output of the adder 79 is "$10/16$" which is added to the event start signal of FIG. 5D, thereby producing Event 2 of FIG. 5J.

Regarding the Event 3, since the integral part data for Event 3 is also "1", the down counter 75 produces a pulse (terminal count) by counting one clock pulse. The terminal count of the down counter 75 is sent to the multiplexer 78, which is in the timing of FIG. 5F, i.e., delayed by three reference clock counts from the reference point. However, because the vernier sum of "$10/16$" in the previous event is added to the fractional data "$8/16$" of Event 3 by the adder 79, the sum of the fractional data is "$18/16$" for Event 3. Therefore, a carry is provided to the multiplexer 78 to select the output of the flip-flop 77 showing an additional delay by one clock count as an event start signal as shown in FIG. 5G. The remaining data of "$2/16$" is produced at the output of the adder 79 as a vernier sum as shown in FIG. 5H. Thus, Event 3 of FIG. 5K is produced by adding the vernier sum of FIG. 5H to the event start of FIG. 5G.

Figure 8:
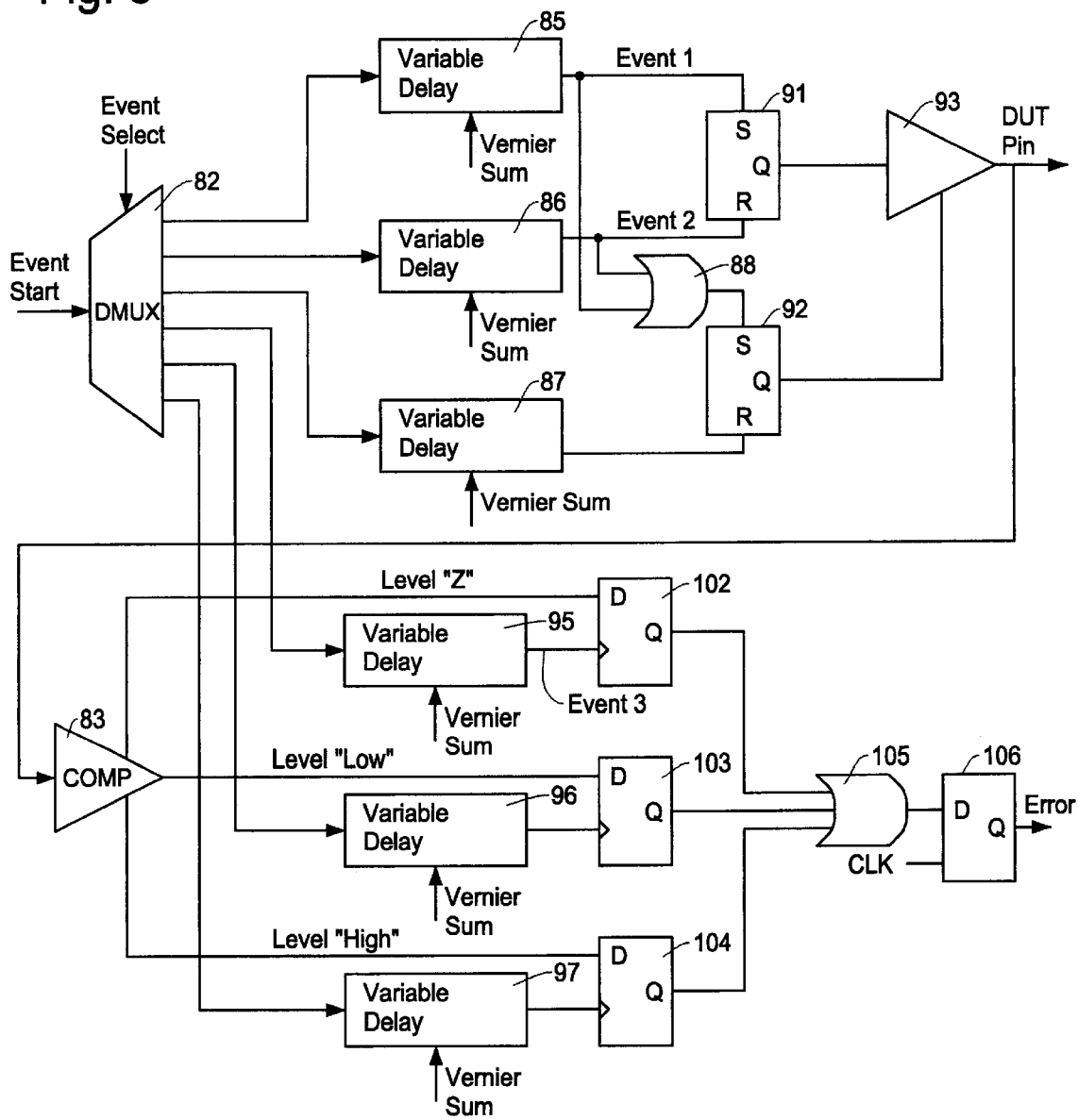
FIG. 8 is a schematic block diagram showing an example of structure in the event generation unit for generating various events based on the data produced by the timing count and scaling logics of FIGS. 6 and 7.

An example of circuit structure in the event generation unit 34 is shown in a circuit diagram of FIG. 8. As briefly described in the foregoing, the event generation unit 34 of FIG. 8 is to generate test signals and strobe signals based on the event start signal and vernier sum provided from the timing count and scaling logic of FIG. 6 or 7.

The circuit diagram of FIG. 8 includes a demultiplexer 82, a comparator 83, variable delay circuits 85–87, an OR circuit 88, SR flip-flops 91 and 92, a pin driver 93, variable delay circuits 95–97, flip-flops 102–104, an OR circuit 105 and a flip-flop 106. The variable delay circuits 85–87 and 95–97 may be actualized by corresponding event processors (not shown) so that the calibrated delay times are selected by the vernier (vernier sum) from the circuit diagram of FIG. 6 or 7. For the convenience of explanation, the pin driver 93 and the comparator 83 are also included in FIG. 8, although these elements may rather be included in the pin electronics 36 of FIG. 3 in an actual implementation.

The output of the pin driver 93 is to provide a test signal to the DUT pin when the DUT pin is an input pin. The desired amplitude and slew rate of the test signal are produced by the pin driver 93. The comparator 83 receives a response output of the DUT when the DUT pin is an output pin. The comparator 83 provides the analog function to compare the analog level of the connected DUT pin with preset voltage ranges and to determine in which range the DUT pin resides. The three possible ranges are, level "High", level "Low", and high impedance. "Z" as in FIG. 8. In this example, only one of these ranges are active one at time.

The demultiplexer 82 receives the event start from the timing count and scaling logic of FIG. 6 or 7 and the event type data from the event type RAM 73 in the event memory 30. The event type data is applied to the select terminal of the demultiplexer 82. Thus, the event start signal is demultiplexed to the corresponding event processor having the variable delay circuit specified by the event type.

When the event type data indicates that the current event (Event 1) is "Drive DUT Pin High", the event start signal is sent to the variable delay 85 wherein it is delayed by the time defined by the vernier sum. Thus, the output of the variable delay circuit (Event 1 such as shown in FIG. 5I) sets the SR flip-flop 91. This will cause the pin driver 93 to drive the connected DUT pin to logic one.

When the event type data indicates that the current event (Event 2) is "Drive DUT Pin Low", the event start signal is sent to the variable delay 86 wherein it is delayed by the time defined by the vernier sum. Thus, the output of the variable delay circuit (Event 2 such as shown in FIG. 5J) resets the SR flip-flop 91. This will cause the pin driver 93 to drive the connected DUT pin to logic zero.

When the event type data indicates that the current event is "Turn Off Drive to DUT", the event start signal is sent to the variable delay 87 wherein it is delayed by the time defined by the vernier sum. Thus, the output of the variable delay circuit resets the SR flip-flop 92. This will place the pin driver 93 connected to the DUT pin into a high impedance state to receive the output of the DUT pin by the comparator 83.

When the pin driver 93 is in the high impedance mode to receive the signal from the DUT pin by the comparator 83, the event is typically used to generate the strobe signal to latch the logic of the comparator output. For example, when the event type data indicates that the current event is "Test DUT for High Impedance", the event start signal is sent to the variable delay 95 wherein it is delayed by the time defined by the vernier sum. The voltage level of the DUT pin is compared against a preprogrammed high impedance level by the comparator 83. If the minimum high impedance level is not achieved, the resultant output of the comparator 83 is latched by the strobe signal (Event 3) from the variable delay circuit 95 in the flip-flop 102. This data indicates failure of the DUT and is clocked through the OR circuit 105 and the flip-flop 106 and output as "Error".

When the event type data indicates that the current event is "Test DUT for Low", the event start signal is sent to the variable delay 96 wherein it is delayed by the time defined by the vernier sum. The voltage level of the DUT pin is compared against a preprogrammed low level by the comparator 83. If the minimum high impedance level is not achieved, the resultant output of the comparator 83 is latched at the timing of the strobe signal from the variable delay circuit 96 in the flip-flop 103. This data indicates failure of the DUT and is clocked through the OR circuit 105 and the flip-flop 106 and output as "Error".

When the event type data indicates that the current event is "Test DUT for High", the event start signal is sent to the variable delay 97 wherein it is delayed by the time defined by the vernier sum. The voltage level of the DUT pin is compared against a preprogrammed low high by the comparator 83. If the minimum high impedance level is not achieved, the resultant output of the comparator 83 is latched at the timing of the strobe signal from the variable delay circuit 97 in the flip-flop 104. This data indicates failure of the DUT and is clocked through the OR circuit 105 and the flip-flop 106 and output as "Error".

FIG. 9 is a schematic diagram showing a system configuration of an event based test system, of the present invention for loading the event data into several pins. Pin cards $115_1$–$115_n$ are connected between a pin bus 113 and a DUT load board 117, where each pin card 115 is individually addressable by a pin bus controller 112. The pin bus controller 112 is connected to a host computer 111 running the test controller software. The pin bus controller 112 provides services of starting, stopping, test results, event data loading and sequencing pins together via global pin bus signals. This architecture allows an "N" pin test system to be built.

Figures 11, 12A:
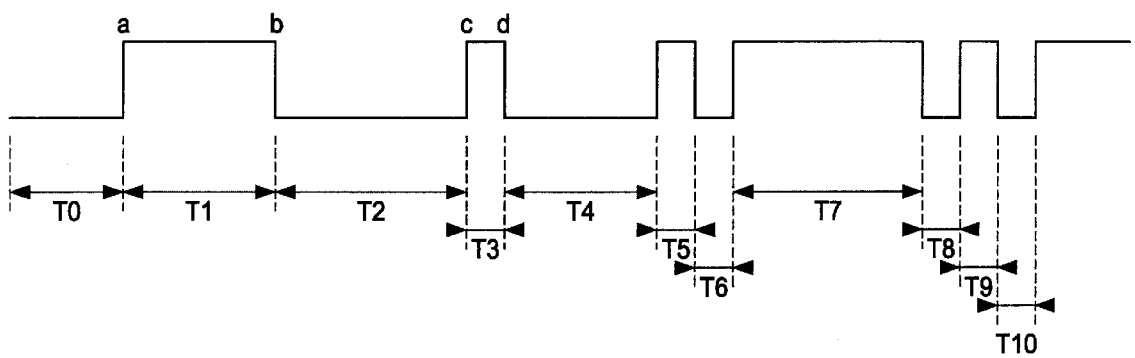
Figure 13:
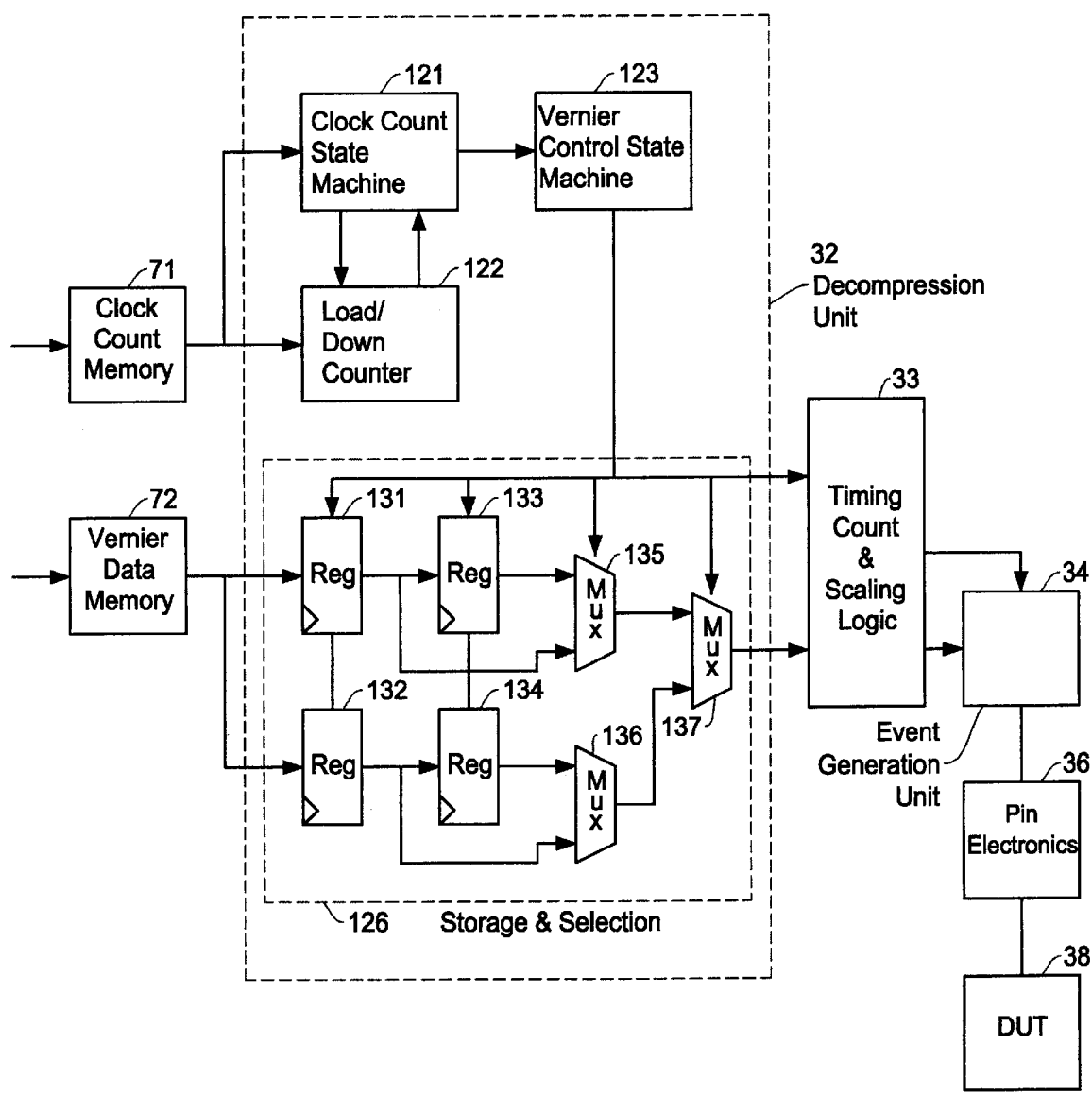
FIG. 13 is a block diagram showing an example of circuit structure in the data decompression unit in the event based test system of the present invention.

FIGS. 11–13 are directed to the compression and decompression technology incorporated in the event based test system of the present invention. The more details of this technology is given in U.S. patent application Ser. No. 09/259,402 owned by the same assignee of the present invention. FIG. 11 is a timing chart showing the series of events T0–T10 defined by timing data which is a combination of clock count data and vernier data. As noted above, the clock count data shows an integer multiple of the reference clock period of the event while vernier data shows a fraction of the reference time period for the corresponding event.

FIG. 12A is a data table showing the timing data in the event memory for defining the events T0–T10 of FIG. 11 without using a compression technology. As shown in FIGS. 6 and 7, the event memory is separated into the clock count memory (clock count RAM) 71 and the vernier data memory (vernier RAM) 72. The data for the clock count memory 71 can be any values from 0 to N number of reference clock periods, where N is the maximum number of reference clock period that the event based test system is desired to support.

For example, in an event based test system designed by the assignee of this invention, the clock count memory 71 supports up to 134,217,728 clock periods. This requires a total of 27 data bits for each event count memory location. Thus, a total size of the event count memory in this case is 27-bit multiplied by M, where M is the number of vectors (test pattern length) in the test system.

As noted above, the vernier data memory stores the fine delay (timing) data specifying the fraction of the reference clock period. Thus, the vernier data is less than one reference clock period. Depending on the fine step delay that the test system supports, the width of the vernier memory needs to be large enough to contain one full reference clock period. For example, in a test system which supports timing resolution as small as 0.2 ns when the reference clock period is 32 ns, the vernier data memory needs to have at least 8 data bits. In the above example of FIG. 12A, the vernier memory 72 has a data width of 10 bits, thus an overall memory size is 10-bit multiplied by M vectors.

Since the size of test vectors is large such as several megabyte or several ten megabyte, an overall size of the event memory becomes very large if the timing data has to be stored in the event memory in the manner shown in the table of FIG. 12A. For example, the number of bits used for describing the clock count data of the events T0–T10 is 297 and the number of bits used for the vernier data of events T0–T10 is 110, resulting in a total of 407 bits.

Therefore, the event based test system of the present invention employs a compression and decompression technology to reduce the capacity of the event memory. FIG. 12B is a data table showing an example of compressed timing data which describes the events T0–T10 of FIG. 11. The number of bits used for the clock count data of events T0–T10 is 88 and the number of bits used for the vernier data is 110, resulting in a total of 198 bits, in contrast to 407 bits in FIG. 12A. In this example, the clock count data is expressed by a unit of word (8 bits) wherein up to four words (32 bits) are used depending on the number of reference clock. The details of structure in each word is shown in the above noted U.S. patent application Ser. No. 09/259,402.

In the example of FIGS. 11 and 12, it is assumed that the clock count data of the event T0 can be expressed by one word, event T1 is two words, event T2 is three words, event T4 is four words, and event T7 is one word, respectively. It is also assumed that each of the events T3, T5, T6, T8, T9 and T10 in FIG. 11 is smaller than the reference clock period. Therefore, by assigning the minimum number of words necessary to express clock count data, an overall memory area in the clock count memory can be decreased. Further, for the events that require less than one reference clock period, the clock count data for these events is zero. Then it is possible to reduce the memory size of the clock count memory 71 by not assigning any memory area for these events while combining vernier data for these events in the vernier data in the vernier data memory 72.

In the example of FIG. 12B, the vernier data memory 72 stores four (4) vernier data per clock count memory location. Thus, the vernier data memory 72 has 40-bit width. This approach may be useful when a test vector contains many events that are less than one reference clock period. Further, combining the vernier data of two or more events allows the test system to operate at faster frequency than the system clock frequency. This is because two or more events can be produced at the same time based on the vernier data at each access (clock) of the event memory. Since the first word of each event count data contains the number of events to be generated, it is possible to identify the correct vernier data for the current event.

An example of circuit structure in the decompression unit 32 is shown in FIG. 13. The decompression unit 32 decompresses the timing data received from the event memory which is compressed by the compression technique of the present invention. In this example, all of the compression and decompression process is performed by system software. The following is a brief description of the decompression unit 32. More detailed description is given in above noted U.S. patent application Ser. No. 09/259,402.

The decompression unit 32 of FIG. 13 includes a clock count state machine 121, a load/down counter 122, a vernier control state machine 123, and a storage and selection circuit 126. This example of storage and selection circuit 126 includes registers 131–134 and multiplexers 135–137. The clock count data from the clock count memory 71 is provided to the clock count state machine 121 and the load/down counter 122. As described with reference to FIGS. 11–12, in the preferred embodiment, the clock count data from the memory 71 is configured by either one, two, three or four data words, each word of which has a structure of 8 bits, i.e., a byte. The vernier data from the vernier data memory 72 is provided to the registers 131 and 132 in the storage and selection circuit 126. As in the foregoing, in the preferred embodiment, the vernier data is formed of 40 bits for describing up to four vernier events.

In receiving the clock count data, the clock count state machine 121 determines the number of data bytes of each event by sampling the most significant bits of clock count data. Based on the determination, the state machine 121 loads the data bytes from the clock count memory 71 to the right location of the load/down counter 122. Each data word is 8-bit and the assigned data bits in the data word are different between the first word and the second to fourth words. The reproduced event count data is sent to the timing count and scaling logic 33.

The storage and selection circuit 126 receives the vernier data from the vernier data memory 72. In the foregoing examples such as shown in the table of FIG. 12B, each memory location of the vernier data memory 72 consists of 40 bits for four (4) vernier data. The vernier data from the memory 72 is alternately set to one of the registers 131 and 132 at a time. Such an interleave operation allows sufficient data be consumed by the timing count and scaling logic 33 even though the access speed of the vernier data memory 72 is low.

The registers 131 and 133 send the specified vernier data in parallel to the multiplexer 135 so that the multiplexer 135 can transmit the correct vernier data in a series fashion to the multiplexer 137. Similarly, the registers 132 and 134 send the specified vernier data in parallel to the multiplexer 136 so that the multiplexer 136 can transmit the correct vernier data in a series fashion to the multiplexer 137. Such operations of selecting the vernier data in the registers 131–134 and the multiplexers 135–137 are made under the control of the vernier control state machine 123. The selected vernier data is sent to the event count and scaling logic 33.

Figure 14:
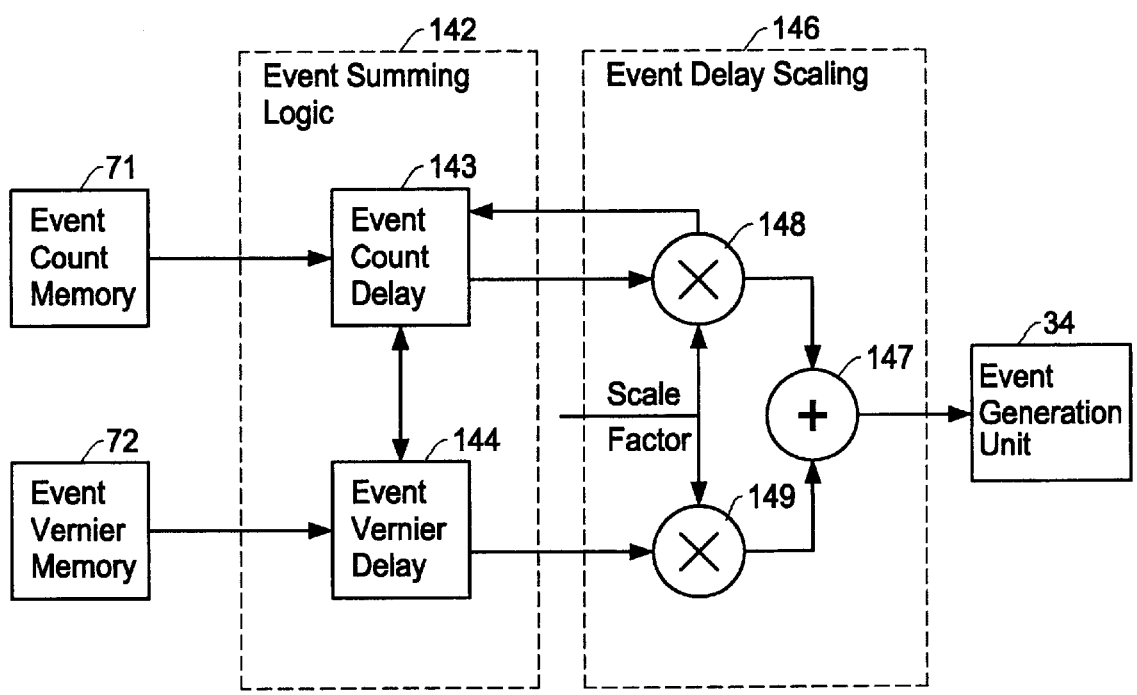
FIG. 14 is a schematic block diagram showing an example of structure in the scaling logic in the event based test system of the present invention.
Figure 15:
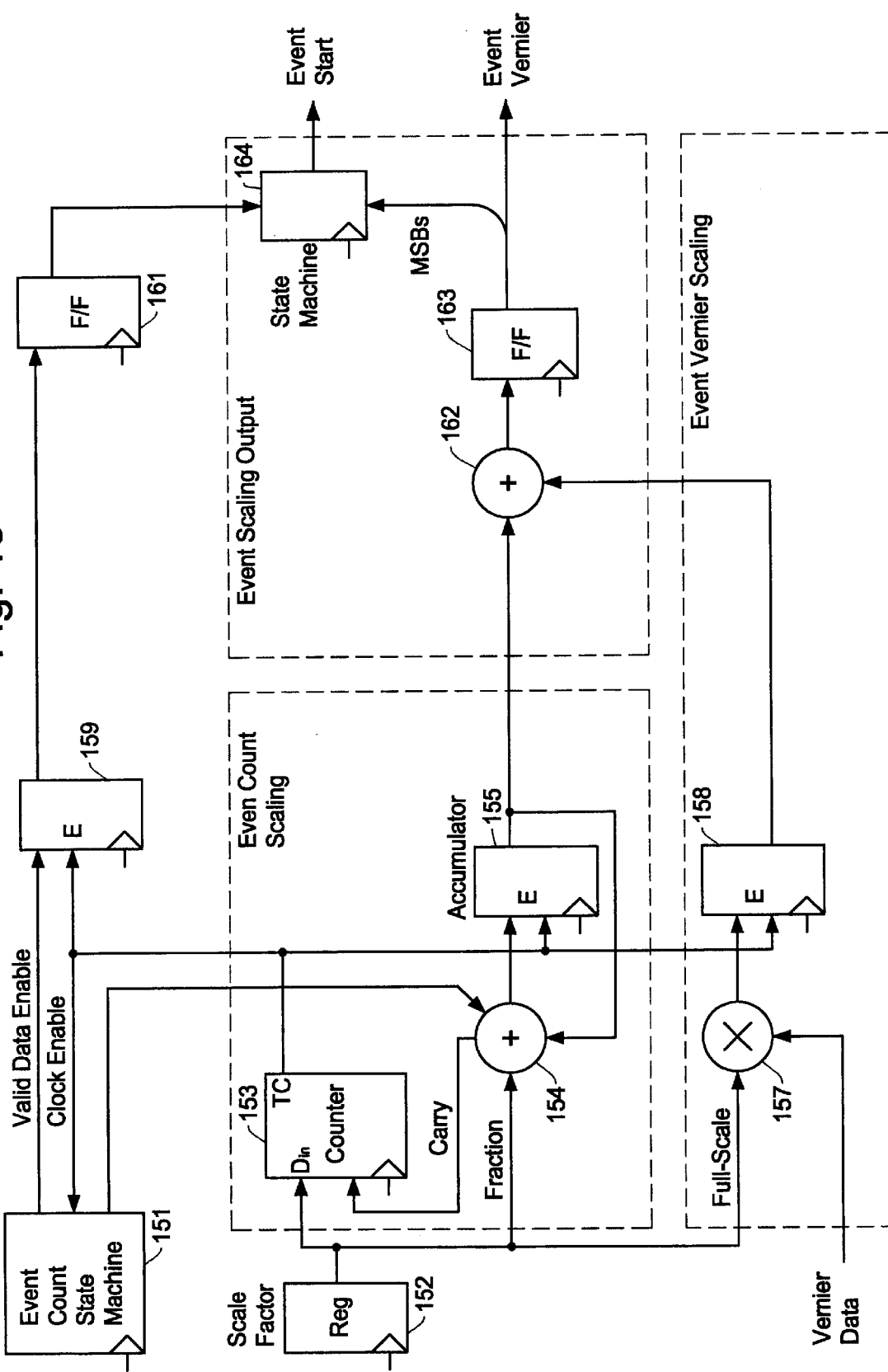
FIG. 15 is a block diagram showing a more detailed example of structure in the scaling logic in the event based test system of the present invention.

FIGS. 14–16 are directed to the scaling technology incorporated in the event based test system of the present invention. The more detailed description is given in U.S. patent application Ser. No. 09/286,226 owned by the same assignee of the present invention. FIG. 14 is a schematic block diagram showing an example of basic structure in the scaling logic in the event count and scaling logic 33. The purpose of the scaling is to either enlarge or reduce the timing data in proportion to a scale factor without changing the timing data in the event memory.

The basic configuration of FIG. 14 includes an event summing logic 142 and an event delay scaling logic 146. Basically, the event summing logic 142 corresponds to the circuit diagram of FIG. 7 for summing the delta vernier data of a plurality of events. The event summing logic 142 includes an event count delay 143 and an event vernier delay 144. The event count delay 143 is basically a down counter to count the reference clock to produce a terminal count when the event count data preset in the down counter reaches zero. The event vernier delay 144 is, for example, an accumulator for summing the vernier data and provides a carry over signal to the event count delay 143 when the sum exceeds one reference clock cycle, thereby adding one reference clock in the event count delay. The terminal count signal from the event count delay 143 and the vernier sum (remainder) from the event vernier delay 144 are provided to the event delay scaling 146.

A multiplier 148 receives the resultant integral delay value from the event count delay logic 143. The integral delay value is multiplied by the scale factor in the multiplier 148. A multiplier 149 receives the resultant vernier delay value from the event vernier delay logic 144. The vernier delay value is multiplied by the scale factor in the multiplier 149. The scaled results from both the multipliers 148 and 149 are added by an adder 147. An integral number in the result of the vernier scaling must be added to the integral part delay by the adder 147. Then, the integral part delay and the fractional part delay at the output of the adder 147 are provided to the event generation unit 34.

FIG. 15 shows a specific example of scaling logic using a scaling factor to multiply the timing data. Brief explanation of the implementation of FIG. 15 is made in the following. The more detailed description is given in the above noted U.S. patent application Ser. No. 09/286,226. An event count state machine 151 corresponds, in part, to the event count delay 143 in the event summing logic 142 of FIG. 14. The event count state machine 151 produces a valid data enable based on an integral part of delay data accumulated throughout all of the previous events. A register 152 stores the scaling factor.

The embodiment of FIG. 15 basically formed with an event count scaling, an event vernier scaling, and an event scaling output. The event count scaling roughly corresponds to the multiplier 148 in FIG. 14 and the event vernier scaling roughly corresponds to the multiplier 149 in FIG. 14. Further, the event scaling output roughly corresponds to the adder 147 in FIG. 14. The valid data enable from the state machine 151 produced based on the accumulated event count data is sent to the event scaling output through a register 159 and a flip-flop 161 thereby producing an event start signal of the event. The event scaling output also produces event vernier data (vernier sum) showing the fractional part of the event which is a delay timing relative to the event start signal.

The scaling factor from the register 152 is provided to the event count scaling and the event vernier scaling in FIG. 15. The event count scaling includes a scaling counter 153, an accumulator formed with an adder 154 and a register 155.

The event vernier scaling includes a multiplier 157 and a register 158. The event scaling output includes an adder 162, a flip-flop 163 and a state machine 164. Although not specifically shown, the reference clock is commonly provided to each circuit components of FIG. 15.

In this example, in the event count scaling, the fractional component of the scaling factor is provided to the adder 154 while the integral component of the scaling factor is provided to the counter 153. In the event vernier scaling, the full-scale value (integral and fractional components) of the scale factor is provided to the multiplier 157. The vernier data from the event vernier memory is provided to the multiplier 157 to be multiplied by the scale factor.

The integral component of the scale factor presets the scaling counter 153, so that a terminal count (TC) pulse is generated from the scaling counter 153 every time when the counted value reaches the preset value. For example, when the integral component of the scale factor shows "3", the scaling counter 153 generates the terminal count pulse every time when counting three pulses of the reference clock. The terminal count pulse is provided to the event count state machine 151 as a clock enable signal so that the valid data enable is produced when the number of terminal count pulses reaches the accumulated event count value specified in the state machine 151.

The terminal count pulse from the scaling counter 153 is also supplied to the registers 155 and 158. As noted above, since the register 155 and the adder 154 form the accumulator, the fractional component of the scaling factor is added to the previous fractional component every time when the terminal count pulse is received by the register 155. In the case where the accumulated fractional component exceeds an integer number such as "1", i.e., one reference clock cycle, a resultant carry signal is received by the scaling counter 153 to add an extra delay of one reference clock cycle before generating the terminal count pulse therefrom.

In the event vernier scaling, the register 158 transmits the vernier value, resulted from multiplying the vernier data by the scaling factor, to the adder 162 in the event scaling output. Thus, the adder 162 in the event scaling output adds the accumulated fractional component from the register (accumulator) 155 to the scaled vernier data from the register 158. In the case where the result of summing produces an overflow, i.e., an integer number, the most significant bit (MSB) showing such an integer number is provided to the state machine 164 to add an extra delay defined by the integer number. Based on the timing defined by the extra delay, the state machine 164 issues the valid data enable or an event start signal which is provided to the event generation unit 34 (FIG. 14). The fractional component of the scaled event vernier is produced by the event scaling output which is also provided to the event generation unit 34.

According to the present invention, the event based semiconductor test system is capable of producing the test signals and strobes based on the event data stored in the event memory to evaluate the semiconductor device. The timing of each of the events is defined by a difference of time length from the common reference point (absolute time) or from the last event (delta time). The test signals and strobes are produced based on event information whose delta time from the previous event is defined by a combination of an integer multiple of the reference clock period and a fraction of the reference clock period.

The event based semiconductor test system of the present invention can produce test signals and strobes directly with use of timing data in the event memory. The event based semiconductor test system of the present invention is capable of directly using data produced by a test bench of a CAD system in the design stage of the semiconductor device under test for generating test signals and strobes.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. An event based test system for testing an electronics device under test (DUT) by supplying a test signal to the DUT and evaluating an output of the DUT at a timing of a strobe signal, comprising:

an event memory for storing timing data of each event formed with an integer multiple of a reference clock period (integral part data) and a fraction of the reference clock period (fractional part data) and event type data representing a type of each event to be generated by said event based test system, said timing data being a time difference between a current event and a predetermined reference point;

an address sequencer for generating address data for accessing said event memory to read out said timing data therefrom;

an event count logic for generating an event start signal which is delayed by the reference clock period multiplied by the integral part data;

a decompression unit provided between said event memory and said event count logic for reproducing event data from compressed event data stored in said event memory;

an event generation unit for generating each event based on said event start signal from said event count logic and the fractional part data and said event type data from said event memory for formulating said test signal or strobe signals; and a host computer for controlling an overall operation of said event based test system.

2. An event based test system as defined in claim 1, wherein said event count logic includes a scaling logic which modifies the event data from said event memory in proportion to a scaling factor.

3. An event based test system as defined in claim 1, further comprising a failure memory for storing fail information of said DUT resulted from applying a test signal to said DUT and evaluating response outputs of said DUT at timings of strobe signals.

4. An event based test system as defined in claim 1, wherein said event memory is comprised of:

a clock count memory for storing said integral part data of said timing data of each event;

a vernier memory for storing said fractional part data of said timing data of each event; and an event type memory for storing said event type data representing a type of each event corresponding to said timing data in said clock count memory and vernier memory.

5. An event based test system as defined in claim 1, wherein said event count logic is comprised of a down counter for presetting said integral part data therein and down counting said integral part data by said reference clock for producing a delay time which is an integer multiple of said reference clock period.

6. An event based test system as defined in claim 1, wherein said event generation unit is comprised of;
- a demultiplexer for selectively providing said event start signal from said event count logic based on event type data from said event memory;
- a plurality of variable delay circuits for receiving said event start signal from said demultiplexer, each of said variable delay circuits providing an additional delay defined by said fractional part data from the event memory;
- means for producing said test signals based on output signals of at least two of said variable delay circuits; and
- means for producing said strobe signals based on an output signal of at least one of said variable delay circuits.

7. An event based test system for testing an electronics device under test (DUT) by supplying a test signal to the DUT and evaluating an output of the DUT at a timing of a strobe signal, comprising:
- an event memory for storing timing data of each event formed with an integer multiple of a reference clock period (integral part data) and a fraction of the reference clock period (fractional part data) and event type data representing a type of each event to be generated by the event based test system, said timing data being a time difference between two adjacent events, said timing data being stored in said event memory in a compressed form;
- an address sequencer for generating address data for accessing said event memory to read out said timing data therefrom;
- a decompression unit for reproducing said timing data from said event memory;
- an event count logic for summing said timing data from said decompression unit to produce an event start signal which is delayed from a previous event start signal by the reference clock period multiplied by the integral part data and a vernier data sum which is a sum of the fractional part data of previous events, said event count logic including a delay means for providing an additional delay of one reference clock period to said event start signal every time when said sum of said fractional part data exceeding said reference clock period;
- an event generation unit for generating a current event based on said event start signal and said vernier data sum from said event count logic and said event type data from said event memory for forming said test signal and strobe signal, said current event being generated at a timing which is delayed by said vernier data sum relative to said event start signal; and
- a host computer for controlling an overall operation of said event based test system.

8. An event based test system as defined in claim 7, wherein said event count logic includes a scaling logic which modifies the event data received by said event count logic in proportion to a scaling factor.

9. An event based test system as defined in claim 7, further comprising a failure memory for storing fail information of said DUT resulted from applying a test signal to said DUT and evaluating response outputs of said DUT at timings of strobe signals.

10. An event based test system as defined in claim 7, wherein said event memory is comprised of:
- a clock count memory for storing said integral part data of said timing data of each event;
- a vernier memory for storing said fractional part data of said timing data of each event; and
- an event type memory for storing said event type data representing a type of each event corresponding to said timing data in said clock count memory and vernier memory.

11. An event based test system as defined in claim 7, wherein said event count logic for summing said timing data is comprised of;
- a down counter for presetting said integral part data therein and down counting said integral part data by said reference clock for producing a delay time which is an integer multiple of said reference clock period;
- a flip-flop for delaying an output of said down counter by one reference clock period;
- a multiplexer provided with said output of said down counter and an output of said flip-flop for selectively producing one of said outputs as said event start signal; and
- an adder for adding said fractional part data of a current event from said event memory to fractional part data of previous events, thereby producing said vernier data sum, said adder generating a carry signal every time when the result of adding said fractional part data exceeding said reference clock period;
- wherein said multiplexer selects said output of said flip-flop when receiving said carry signal from said adder.

12. An event based test system as defined in claim 7, wherein said event generation circuit is comprised of;
- a demultiplexer for selectively providing said event start signal from said event count logic based on said event type data from said event memory;
- a plurality of variable delay circuits for receiving said event start signal from said demultiplexer, each of said variable delay circuits providing an additional delay defined by said vernier sum data from said event count logic;
- means for producing said test signals based on output signals of at least two of said variable delay circuits; and
- means for producing said strobe signals based on an output signal of at least one of said variable delay circuits.

* * * * *